(12) United States Patent
Quon et al.

(10) Patent No.: US 6,979,954 B2
(45) Date of Patent: Dec. 27, 2005

(54) INTER-STAGE PLASMA SOURCE

(75) Inventors: Bill H Quon, Brea, CA (US); Wayne L Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 1 day.

(21) Appl. No.: 10/743,264

(22) Filed: Dec. 23, 2003

(65) Prior Publication Data

US 2004/0160191 A1    Aug. 19, 2004

Related U.S. Application Data

(63) Continuation of application No. PCT/US02/20868, filed on Jul. 2, 2002.

(60) Provisional application No. 60/302,361, filed on Jul. 3, 2001.

(51) Int. Cl.[7] .............................................. H01J 7/24
(52) U.S. Cl. ........................... 315/111.91; 315/111.81; 315/111.71; 417/48; 417/50
(58) Field of Search ................ 315/111.91, 111.81, 315/111.21, 111.31; 417/48–50; 118/723 I, 118/723 E; 156/345.1

(56) References Cited

U.S. PATENT DOCUMENTS

| | | | |
|---|---|---|---|
| 4,641,060 A | 2/1987 | Dandl | 315/111.71 |
| 5,607,542 A | 3/1997 | Wu et al. | 118/723 I |
| 6,030,486 A * | 2/2000 | Loewenhardt et al. | 156/345.46 |
| 6,168,726 B1 * | 1/2001 | Li et al. | 216/79 |
| 6,562,189 B1 * | 5/2003 | Quiles et al. | 156/345.48 |
| 6,773,544 B2 * | 8/2004 | Carducci et al. | 156/345.1 |
| 2003/0150562 A1 * | 8/2003 | Quon | 118/723 E |
| 2004/0151595 A1 * | 8/2004 | Quon et al. | 417/49 |

FOREIGN PATENT DOCUMENTS

WO    WO 00/00741    1/2000

* cited by examiner

*Primary Examiner*—Thuy V. Tran
*Assistant Examiner*—Ephrem Alemu
(74) *Attorney, Agent, or Firm*—Pillsbury Winthrop Shaw Pittman LLP (57) ABSTRACT

A high efficiency plasma pump for use in a plasma processing system that includes a plasma processing device having a first plasma density proximate a processing region and a second plasma density proximate an exit region is disclosed. The plasma pump includes an inter-stage plasma (ISP) source fluidly coupled to the plasma processing device proximate the exit region, the ISP source comprising an inter-stage plasma region having a third plasma density; and a plasma pump fluidly coupled to the ISP, the plasma pump having a fourth plasma density, wherein pumping speed is dependent upon the third plasma density and the fourth plasma density. The ISP source increasing the third plasma density to increase the pumping efficiency.

11 Claims, 7 Drawing Sheets

INTER-STAGE PLASMA SOURCE

This application is a continuation of International Application No. PCT/US02/20868, filed Jul. 2, 2002; which, in turn, derives benefit from U.S. Provisional Application No. 60/302,361, filed Jul. 3, 2001, the contents of which are incorporated herein by reference in its entirety. This application is also related to U.S. Provisional Applications 60/231,878, filed Sep. 12, 2000 and 60/298,877, filed Jun. 19, 2001, the contents of both of which are incorporated herein by reference in their entirety.

FIELD OF THE INVENTION

The present invention relates to plasma vacuum pumps, an in particular relates to an inter-stage plasma source for a plasma vacuum pump.

BACKGROUND OF THE INVENTION

Typically, plasma is a collection of charged particles containing approximately equal numbers of positive and negative charges and can be used in certain processing systems which are useful for a wide variety of applications. For example, plasma processing systems are of considerable use in the manufacture and processing of semiconductors and integrated circuits, both for etching and layer deposition on substrates, such as, for example, semiconductor wafers.

Generally, the basic components of such a system include a plasma chamber enclosing a processing region in which plasma is formed and a pumping region connecting to a vacuum port. Other basic components of such a system generally include a wafer supporting chuck, which is connected to a RF power supply in order to accelerate the plasma ions to strike the wafer surface with a desired energy. This RF power may often produce the process plasma; however, an additional electrode or RF antenna can be used to produce the process plasma.

The chuck is normally cylindrical and flat, supporting a 200 to 300 mm, or larger, diameter wafer for processing. For efficient use of chamber space, i.e. maximizing gas flow uniformity and minimizing the reactor footprint, process gases are injected above or around the plasma region, and the used gases are removed through an annular passage between the chuck and the sidewall to the vacuum pumping port provided in the lower portion of the vacuum chamber. With a large mass flow rate of processing gases, a large pumping speed for removing the used gases is a critical issue relating to process performances, such as the etch rate, high aspect ratio etch, feature profile, damage and contamination. The gas conductance of the annular region often severely restricts the pumping speed delivered to the processing region.

The possibility of employing plasma vacuum pumping in plasma processing systems has been described, for example, in U.S. Pat. No. 4,641,060, which issued to Dandl on Feb. 3, 1987. This system required "magnetized plasmas" and does not appear to be particularly suitable for typical plasma process systems.

Plasma vacuum pumps are capable of pumping a variety of gasses, including hydrogen and helium, with relatively high efficiencies, and are relatively immune to damage by solid or corrosive materials. The operation of such plasma vacuum pumps generally involves transforming a neutral gas into a plasma which then may be magnetized or magnetically compressed so as to be guided through suitable structures, such as a conduit. "Magnetized plasmas" as used herein is a plasma in which the electron flow is magnetized, i.e., the electrons circulate around the magnetic field lines. Momentum can be imparted to the plasma as a result of various electromagnetic interactions and can be imparted to the neutral gas through collisions between molecules of the neutral gas and moving ions which have been accelerated and have greater momentum than background gas. Therefore, the plasma can be pumped from the processing region to a second region, such as a discharge plasma region, which is generally maintained at a higher pressure than the processing region.

In the plasma vacuum pumping cell, described by Johnson et al. in pending U.S. patent application Ser. No. PCT/US99/12827, a plurality of magnets is positioned relative to the conduit in a manner to provide lines of magnetic force that extend along the conduit; and an electric potential source is disposed relative to the conduit to create an electric field which accelerates the ions from the conduit to the second region. A plurality of these pumping cells is arranged in a large area interfacing the plasma. This plasma vacuum pump utilizes the process plasma as the pumping medium, and, therefore, the pumping speed suffers for process systems that do not provide a high density plasma or dispose a sufficiently large pumping area interfacing the plasma.

Furthermore, the effluent gases from the process plasma usually include perfluorocompounds (PFCs), such as $CF_4$, $CHF_3$, $C_2F_6$, $C_3F_8$, $C_4F_8$, $C_5F_8$, $SF_6$, and $NF_3$, which are considered as greenhouse gases. In 1996 the American semiconductor industry signed a memorandum of understanding with the United States Environmental Protection Agency in which manufacturers committed to reducing emission of the greenhouse gases.

In the prior plasma pumps, the pumping action is severely limited by the plasma density at the input of the plasma pump. There is a need for increasing the plasma density at the input to the plasma pump to increase the pumping efficiency.

BRIEF SUMMARY OF THE INVENTION

In one aspect of the present invention, the high efficiency plasma pump is used in a plasma processing system that comprises a plasma processing device having a first plasma density proximate a processing region and a second plasma density proximate an exit region and a high efficiency plasma pump comprising: (i) an inter-stage plasma (ISP) source fluidly coupled to the plasma processing device proximate the exit region, the ISP source comprising an inter-stage plasma region having a third plasma density; and (ii) plasma pump fluidly coupled to the ISP, the plasma pump having a fourth plasma density, wherein pumping speed is dependent upon the third plasma density and the fourth plasma density.

The present invention envisions a method of operating a plasma processing system comprising the steps of (i) creating a plasma in a plasma processing device, the plasma having a first plasma density proximate a processing region and a second plasma density proximate an exit region; (ii) moving a first number of particles from the exit region into an inter-stage plasma (ISP) source that is fluidly coupled to the plasma processing device proximate the exit region; (iii) creating an inter-stage plasma having a third plasma density, the ISP source providing RF energy to the first number of particles in an inter-stage plasma region; and (iv) pumping a second number of particles from the inter-stage plasma region to an exit region, wherein a plasma pump is fluidly coupled to the ISP, the plasma pump having a fourth plasma density, wherein pumping speed is dependent upon the third plasma density and the fourth plasma density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, embodiments of the invention, and together with the general description given above and the detailed description of the embodiments given below, serve to explain the principles of the invention wherein.

DETAILED DESCRIPTION OF THE INVENTION

Embodiments of the present invention will be described hereinafter with reference to the accompanying drawings. In the following description, the constituent elements having substantially the same function and arrangement are denoted by the same or similar reference numerals, and repetitive descriptions will be made only when necessary.

Figure 1:
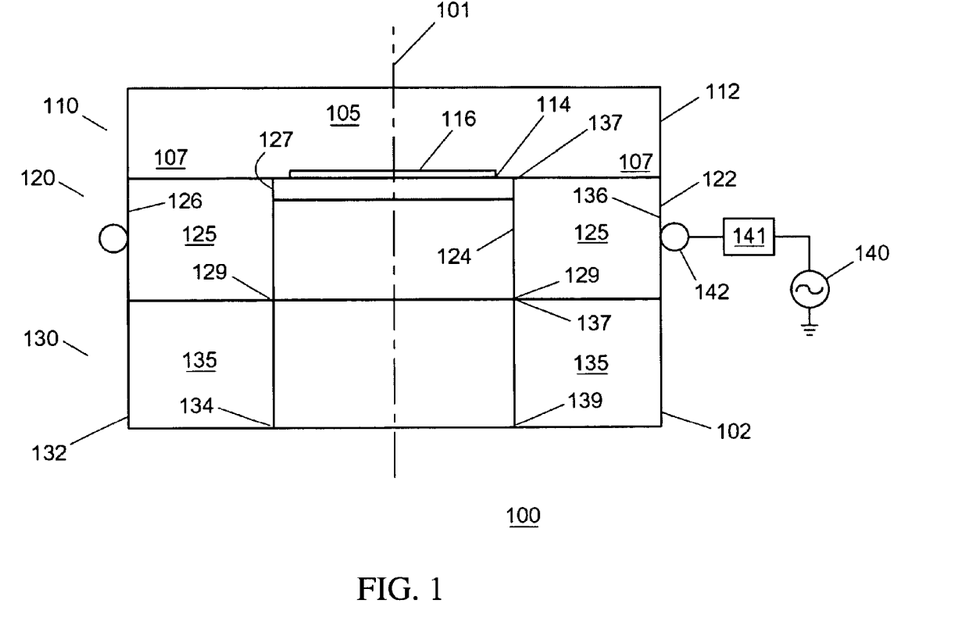
FIG. 1 is a schematic view showing a plasma processing system embodying the principles of the present invention.

FIG. 1 is a schematic view showing a plasma processing system embodying the principles of the present invention. Plasma processing system 100 comprises plasma processing device 110, inter-stage plasma source 120, and plasma pump 130.

Inter-stage plasma source, generally indicated at 120, is coupled to the plasma processing device, generally indicated at 110, and is coupled to the plasma pump, generally indicated at 130. As shown in FIG. 1, inter-stage plasma (ISP) source 120 includes an inductively coupled plasma (ICP) source.

Plasma processing device 110 comprises chamber 112 that defines a plasma processing region, generally indicated at 105, and an exit region, generally indicated at 107. During processing, plasma processing region 105 contains a processing plasma (not shown) having a first plasma density, and exit region 107 contains a plasma (not shown) having a second plasma density. For example, the number of particles per unit volume in plasma processing region 105 is greater than the number of particles per unit volume in exit region 107.

Those skilled in the art will recognize that chamber 112 can contain mounting device 114 which can be configured to attach substrate 116 thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 110, for example by a gas supply system (not shown). The gas supply system and gas are selected according to the desired application as understood by one skilled in the art. Plasma processing device 110 can comprise a plasma source to produce a plasma within plasma processing region 105 and exit region 107. The plasma in exit region 107 can also be referred to as a source plasma for a plasma pump.

Inter-stage plasma (ISP) source 120 comprises housing 122, which includes channel 125 that contains a plurality of particles that are diffused from the plasma in exit region 107. The plasma in channel 125 can be referred to as an inter-stage plasma. Interior duct wall 124 of channel 125 extend between inlet end 127 and outlet end 129 thereof.

In the illustrated embodiment, channel 125 has an annular shape relative to longitudinal axis 101 and is formed, for example of aluminum. For example, inner channel wall 124 has a generally cylindrical shape and is made from a metal oxide such as alumina or silica (quartz) or another insulator or dielectric material. Inner wall 124 is provided along the interior periphery of channel 125 and extends generally parallel to the longitudinally extending axis 101. In addition, housing 122 has a generally cylindrical shape and is also made from a metal oxide such as alumina or silica (quartz) or another insulator or dielectric material. Housing 122 is provided along the exterior periphery of channel 125 and extends generally parallel to the longitudinally extending axis 101.

Inter-stage plasma source 120 further comprises RF antenna 142, and matching network 141. As illustrated in FIG. 1, RF source 140 is coupled to RF antenna 142 through matching network 141.

In FIG. 1, a single turn RF antenna 142 is shown extending circumferentially around housing 122. RF power at suitable frequencies and power levels is applied to RF antenna 142 through matching network 141. Also not shown in FIG. 1 are means such as Faraday shields and dielectric windows well known to those skilled in the art of RF plasma sources. The purpose of ISP source 120 is to increase the plasma density at the inlet end of plasma pump 130 thereby increasing the pumping efficiency. Through suitable adjustment of the RF power to RF antenna 142 the plasma density and temperature can be increased within channel 125.

The "inter-stage" plasma is a high density local plasma which can have a density on the order of many times that of the source plasma. ISP source 120 ionizes neutral gas particles to increase plasma density and the plasma flux in channel 125. Due to the increased ratio of plasma to neutral particle fluxes, ISP source 120 can contribute to enhanced pumping speed and pump compression ratio by ionizing and re-ionizing gas particles in channel 125.

The ISP source also comprises a pair of annular electrodes (not shown) used to control the direction of flow of the plasma. For example a top electrode is included at the interface between the source exit region 107 and the ISP channel 125, and a bottom electrode is included in the region between channel 125 and the plasma pump 135. By biasing the top electrode more positively than the bottom electrode by 10, 20 volts or other voltage determined by those skilled in the art, the plasma in the ISP will be controlled to flow in an unidirectional manner down stream to the pump.

In an alternate embodiment, ISP source 120 and plasma pump 130 can be mounted above plasma processing device 110.

Plasma pump 130 comprises housing 132 that includes conduit 135 that contains a plurality of particles that are diffused from the plasma in ISP source 120. The plasma in conduit 135 can be referred to as pump plasma. Conduit 135 is at a higher pressure than first region 105 and may contain a mixture of charged and neutral particles. Plasma pump 130 is configured to pump charged and neutral particles from exit region 107 into channel 135 where the plasma density is increased using an additional RF source. In addition, plasma pump 130 is configured to pump charged and neutral particles from channel 125 through conduit 135 so that the pumped particles exit plasma pump 130 via openings 102 in housing 132.

Conduit 135 has an interior conduit wall 134 that extends between inlet end 137 and outlet end 139 thereof. Plasma pump 130 includes magnet arrays (not shown) that are constructed and arranged to generate a magnetic field within conduit 135. In one embodiment, the magnetic field provides the mechanism for flowing particles into and through the channels in the ISP.

In the illustrated embodiment, conduit 135 has an annular shape and is formed, for example of aluminum. For example, inner channel wall 134 has a generally cylindrical shape and is made from a metal oxide such as alumina or silica (quartz) or another insulator or dielectric material. Inner wall 134 is provided along the interior periphery of conduit 135 and extends generally parallel to the longitudinally extending axis 101. In addition, housing 132 has a generally cylindrical shape and is also made from a metal oxide such as alumina or silica (quartz) or another insulator or dielectric material. Housing 132 is provided along the exterior periphery of conduit 135 and extends generally parallel to the longitudinally extending axis 101.

In an alternate embodiment, plasma pump 130 can comprise a plurality of cylindrical conduits in a ring pattern around axis 101.

Figure 2:
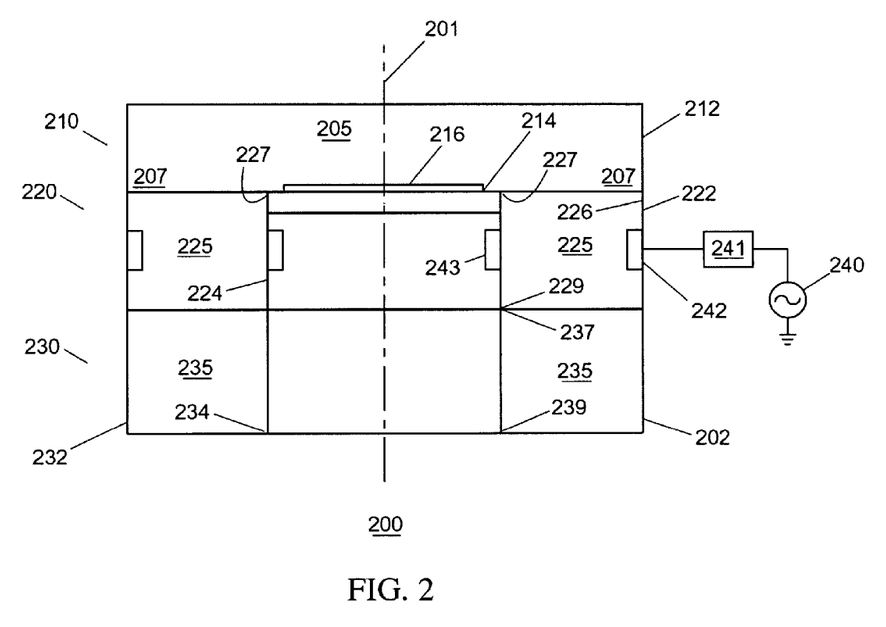
FIG. 2 is a schematic view showing a second plasma processing system embodying the principles of the present invention.

FIG. 2 is a schematic view showing a plasma processing system embodying the principles of the present invention. Plasma processing system 200 comprises plasma processing device 210, inter-stage plasma source 220, and plasma pump 230.

Inter-stage plasma source, generally indicated at 220, is coupled to the plasma processing device, generally indicated at 210, and is coupled to the plasma pump, generally indicated at 230. As shown in FIG. 2, inter-stage plasma (ISP) source 220 includes a capacitively coupled plasma (CCP) source.

Plasma processing device 210 comprises chamber 212 that defines a plasma processing region, generally indicated at 205, and an exit region, generally indicated at 207. During processing, plasma processing region 205 contains a processing plasma (not shown) having a first plasma density, and exit region 207 contains a plasma (not shown) having a second plasma density. For example, the number of particles per unit volume in plasma processing region 205 is greater than the number of particles per unit volume in exit region 207.

Those skilled in the art will recognize that chamber 212 can contain mounting device 214 which can be configured to attach substrate 216 thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 210, for example by a gas supply system (not shown), to be made into plasma. The gas supply system and gas are selected according to the desired application as understood by one skilled in the art. Plasma processing device 210 comprises a plasma source to produce a plasma within plasma processing region 205 and exit region 207. The plasma in exit region 207 can also be referred to as a source plasma for a plasma pump.

ISP source 220 comprises housing 222, which includes channel 225 that contains a plurality of particles that are diffused from the particles in exit region 207. The plasma in channel 225 can also be referred to as an inter-stage plasma. A longitudinal axis 201 and interior duct wall 224 of channel 225 extend between inlet end 227 and outlet end 229 thereof.

In the illustrated embodiment, channel 225 has an annular shape and is formed, for example of aluminum. For example, inner channel wall 224 has a generally cylindrical shape and is made from a metal oxide such as alumina or silica (quartz) or another insulator or dielectric material. Inner wall 224 is provided along the interior periphery of channel 225 and extends generally parallel to the longitudinally extending axis 201. In addition, housing 222 has a generally cylindrical shape and is also made from a metal oxide such as alumina or silica (quartz) or another insulator or dielectric material. Housing 222 is provided along the exterior periphery of channel 225 and extends generally parallel to the longitudinally extending axis 201.

Inter-stage plasma source 220 further comprises a pair of electrodes (242 and 243), and matching network 241. As illustrated in FIG. 2, RF source 240 is coupled to electrode 242 through matching network 241.

In FIG. 2 a pair of electrodes (242 and 243) are shown extending circumferentially around axis 201. Electrode 243 is mechanically and electrically coupled to inner wall 224, thereby forming a grounded electrode. Electrode 242 is mechanically coupled to outer wall 226 but electrically isolated from outer wall 226. RF power at suitable frequencies and power levels is applied to electrode 242 through matching network 241. Through suitable adjustment of the RF power to electrode 242 the plasma density and temperature can be increased within channel 225. For example, the ISP source 220 is used to increase the plasma density at the inlet end of plasma pump 120 thereby increasing the pumping efficiency.

In other embodiments, alternate electrode configurations can be used, and the electrodes can be connected to the RF source differently.

The "inter-stage" plasma is a high density local plasma which can have a density on the order of many times that of the source plasma. ISP source 220 ionizes neutral gas particles to increase plasma density and the plasma flux in channel 225. Due to the increased ratio of plasma to neutral particle fluxes, ISP source 220 can contribute to enhanced pumping speed and pump compression ratio by ionizing and re-ionizing gas particles in channel 225.

The ISP source also comprises a pair of annular electrodes (not shown) used to control the direction of flow of the plasma. For example a top electrode is included at the interface between the source exit region 207 and the ISP channel 225, and a bottom electrode is included in the region between channel 125 and the plasma pump 235. By biasing the top electrode more positively than the bottom electrode by 10, 20 volts or other voltage determined by those skilled in the art, the plasma in the ISP will be controlled to flow in an unidirectional manner down stream to the pump.

In an alternate embodiment, ISP source 220 and plasma pump 230 can be mounted above plasma processing device 210.

Plasma pump 230 comprises housing 232 that includes conduit 235 that contains a plurality of particles that are diffused from the plasma in ISP source 220. The plasma in conduit 235 can be referred to as pump plasma. Conduit 235 is at a higher pressure than first region 205 and may contain a mixture of charged and neutral particles. Plasma pump 230 is configured to pump charged and neutral particles from channel 225 through conduit 235 so that the pumped particles exit plasma pump 230 via openings 202 in housing 232.

Conduit 235 has an interior conduit wall 234 that extends between inlet end 237 and outlet end 239 thereof.

In the illustrated embodiment, conduit 235 has an annular shape and is formed, for example of aluminum. For example, inner channel wall 234 has a generally cylindrical shape and is made from a metal oxide such as alumina or silica (quartz) or another insulator or dielectric material. Inner wall 234 is provided along the interior periphery of conduit 235 and extends generally parallel to the longitudinally extending axis 201. In addition, housing 232 has a generally cylindrical shape and is also made from a metal oxide such as alumina or silica (quartz) or another insulator or dielectric material. Housing 232 is provided along the exterior periphery of conduit 235 and extends generally parallel to the longitudinally extending axis 201.

In an alternate embodiment, plasma pump 230 can comprise a plurality of cylindrical conduits in a ring pattern around axis 201.

Figure 3:
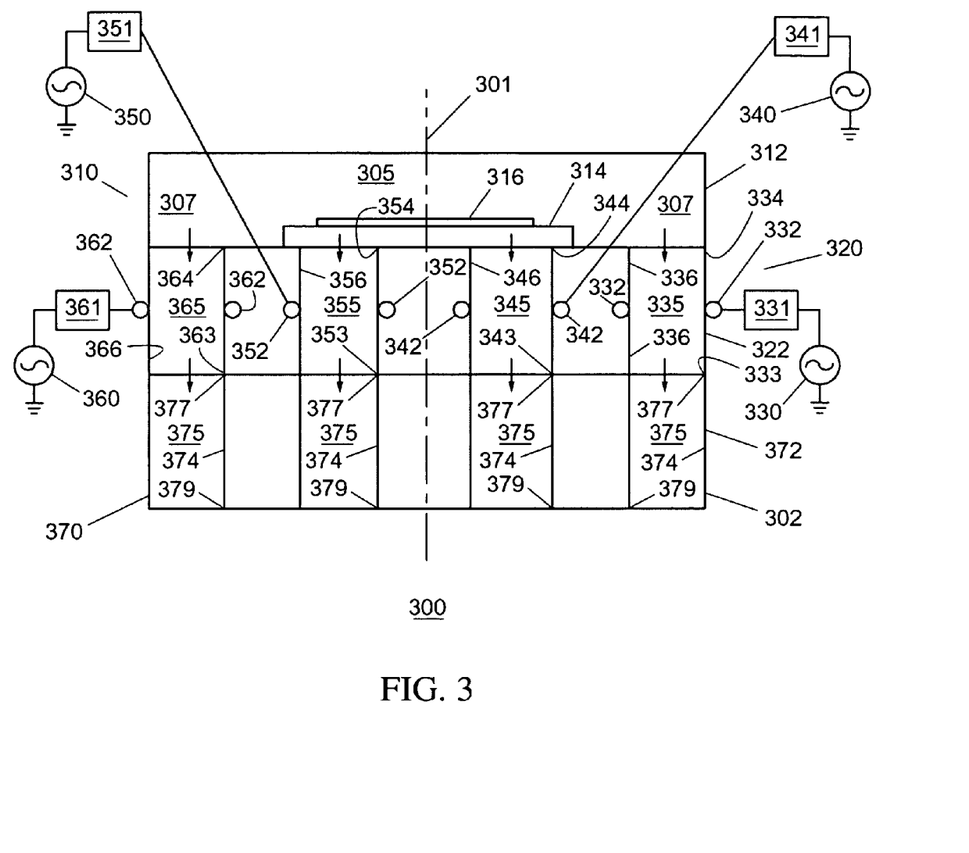
FIG. 3 is a schematic view showing a third plasma processing system embodying the principles of the present invention.

FIG. 3 is a schematic view showing a plasma processing system embodying the principles of the present invention. Plasma processing system 300 comprises plasma processing device 310, inter-stage plasma source 320, and plasma pump 370.

Inter-stage plasma source, generally indicated at 320, is coupled to the plasma processing device, generally indicated at 310, and is coupled to the plasma pump, generally indicated at 370. As shown in FIG. 3, inter-stage plasma (ISP) source 320 includes a plurality of inductively coupled plasma (ICP) source.

Plasma processing device 310 comprises chamber 312 that defines a plasma processing region, generally indicated at 305, and an exit region, generally indicated at per unit volume. During processing, plasma processing region 305 contains a processing plasma (not shown) having a first plasma density, and exit region 307 contains a plasma (not shown) having a second plasma density. For example, the number of particles in plasma processing region 305 is greater than the number of particles per unit volume in exit region 307.

Those skilled in the art will recognize that chamber 312 can contain mounting device 314 which can be configured to attach substrate 316 thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 310, for example by a gas supply system (not shown), to be made into plasma. The gas supply system and gas are selected according to the desired application as understood by one skilled in the art. Plasma processing device 310 comprises a plasma source to produce a plasma within plasma processing region 305 and exit region 307. The plasma in exit region 307 can also be referred to as a source plasma for a plasma pump.

ISP source 320 comprises housing 322, which includes a plurality of channels 335, 345, 355, and 365 that contains a plurality of particles that are diffused from the particles in exit region 307. The plasma in the channels can also be referred to as inter-stage plasmas. Channel 335 comprises interior wall 336 extending between inlet end 334 and outlet end 333 thereof. Channel 345 comprises interior wall 346 extending between inlet end 344 and outlet end 343 thereof. Channel 355 comprises interior wall 356 extending between inlet end 354 and outlet end 353 thereof. Channel 365 comprises interior wall 366 extending between inlet end 364 and outlet end 363 thereof.

In the illustrated embodiment, channels 335, 345, 355, and 365 are cylindrically shaped. Alternately, channels 335, 345, 355, and 365 can have non-cylindrical shapes. Also, channels 335, 345, 355, and 365 are arranged in a ring configuration around axis 301. Housing 322 has a cylindrical shape and is formed, for example of aluminum. For example, inner channel walls 336, 346, 356, and 366 can be made from a metal oxide such as alumina or silica (quartz) or another insulator or dielectric material.

Inter-stage plasma source 320 further comprises RF antennas 332, 342, 352, and 362 which are shown extending circumferentially around channels 335, 345, 355, and 365, respectively. As illustrated in FIG. 1, RF source 330 is coupled to RF antenna 332 through matching network 331; RF source 340 is coupled to RF antenna 342 through matching network 341; RF source 350 is coupled to RF antenna 352 through matching network 351; and RF source 360 is coupled to RF antenna 362 through matching network 361. Alternatively, a different number of RF sources and/or matching networks can be used.

In FIG. 3, a single turn RF antenna is shown extending circumferentially around a channel. Those skilled in the art will recognize that the RF antennas can comprise different numbers of turns.

RF power at suitable frequencies and power levels is applied to the RF antennas through the matching networks. Also not shown in FIG. 3 are means such as Faraday shields and dielectric windows well known to those skilled in the art of RF plasma sources.

The purpose of ISP source 320 is to increase the plasma density at the inlet end of plasma pump 370 thereby increasing the pumping efficiency. Through suitable adjustment of the RF powers to RF antennas the plasma density and temperature can be increased within channels 335, 345, 355, and 365.

The "inter-stage" plasma is a high density local plasma which can have a density on the order of many times that of the source plasma. ISP source 320 ionizes neutral gas particles to increase plasma density and plasma flux in the channels. Due to the increased ratio of plasma to neutral particle flux, ISP source 320 can contribute to enhanced pumping speed and pump compression ratio by ionizing and re-ionizing gas particles in the channels.

The ISP source also comprises a pair of annular electrodes (not shown) used to control the direction of flow of the plasma. For example a top electrodes are included at the interface between the source exit region 307 and the ISP channel 335, 345, 355, and 365 and a bottom electrodes are included in the region between channel 335, 345, 355, and 365 and the plasma pump 375. By biasing the top electrodes more positively than the bottom electrodes by 10, 20 volts or other voltage determined by those skilled in the art, the plasma in the ISP will be controlled to flow in an unidirectional manner down stream to the pump.

In an alternate embodiment, ISP source 320 and plasma pump 330 can be mounted above plasma processing device 310.

Plasma pump 370 comprises housing 372 that includes a plurality of conduits 375 that contain plurality of particles that are pumped from the plasma in ISP source 320. The plasma in conduits 375 can be referred to as pump plasma. Conduits 375 are at a higher pressure than first region 305 and can contain a mixture of charged and neutral particles. Plasma pump 330 is configured to pump charged and neutral particles from channels 335, 345, 355, and 365 through conduits 375 so that the pumped particles exit plasma pump 330 via openings 302 in housing 372.

Conduits 335 have interior conduit walls 374 that extends between inlet end 377 and outlet end 379 thereof.

In the illustrated embodiment, conduits 375 are cylindrically shaped and are formed, for example of a metal oxide such as alumina or silica (quartz) or another insulator or dielectric material. In addition, housing 372 has a generally cylindrical shape and is also made from a metal oxide such as alumina or silica (quartz) or another insulator or dielectric material. Housing 332 is provided along the exterior periphery of conduits 375 and extends generally parallel to the longitudinally extending axis 301.

In an alternate embodiment, plasma pump 370 can comprise a ring shaped conduit around axis 301.

Figure 4:
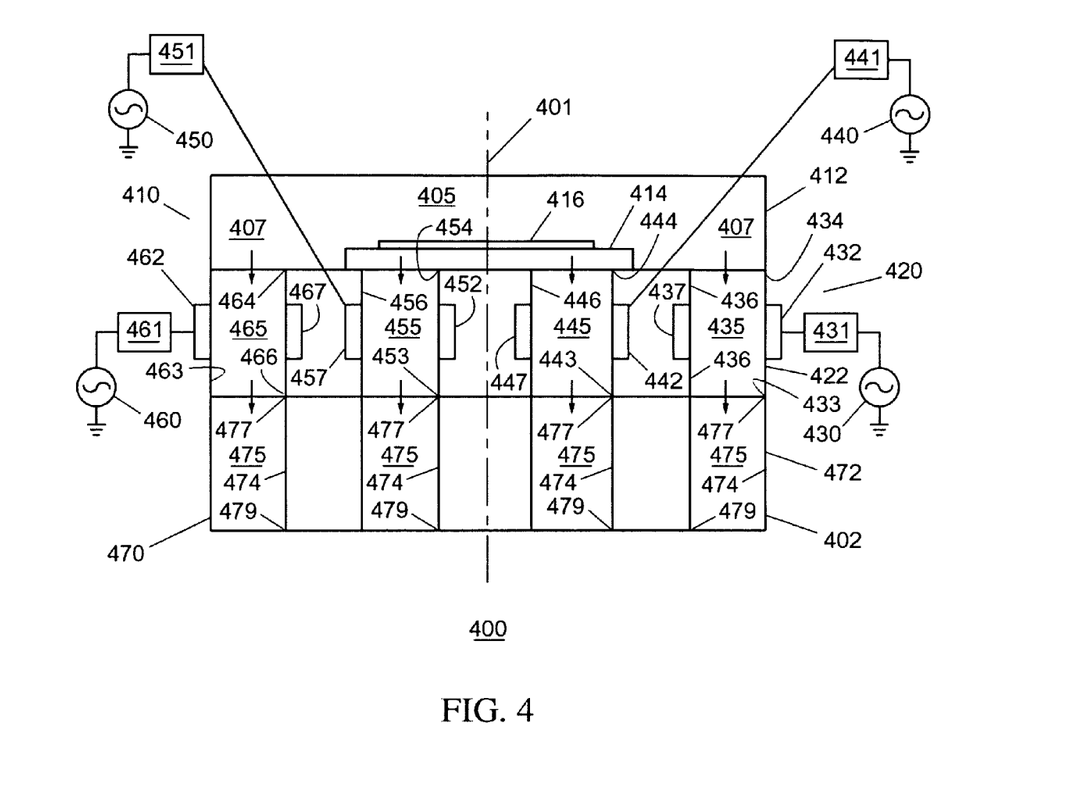
FIG. 4 is a schematic view showing a fourth plasma processing system embodying the principles of the present invention.

FIG. 4 is a schematic view showing a plasma processing system embodying the principles of the present invention. Plasma processing system 400 comprises plasma processing device 410, inter-stage plasma source 420, and plasma pump 470.

Inter-stage plasma source, generally indicated at 420, is coupled to the plasma processing device, generally indicated at 410, and is coupled to the plasma pump, generally indicated at 470. As shown in FIG. 4, inter-stage plasma (ISP) source 420 includes a plurality of inductively coupled plasma (ICP) source.

Plasma processing device 410 comprises chamber 412 that defines a plasma processing region, generally indicated at 405, and an exit region, generally indicated at 407. During processing, plasma processing region 405 contains a processing plasma (not shown) having a first plasma density, and exit region 407 contains a plasma (not shown) having a second plasma density. For example, the number of particles per unit volume in plasma processing region 405 is greater than the number of particles per unit volume in exit region 407.

Those skilled in the art will recognize that chamber 412 can contain mounting device 414 which can be configured to attach substrate 416 thereon in order to deposit a layer of material on, or etch material from, the substrate surface.

A plasma generation gas or any other gas which is ionizable to produce a plasma, for example, argon gas, nitrogen gas, xenon gas, or the like, is introduced into plasma processing device 410, for example by a gas supply system (not shown), to be made into plasma. The gas supply system and gas are selected according to the desired application as understood by one skilled in the art. Plasma processing device 410 comprises a plasma source to produce a plasma within plasma processing region 405 and exit region 407. The plasma in exit region 407 can also be referred to as a source plasma for a plasma pump.

ISP source 420 comprises housing 422, which includes a plurality of channels 435, 445, 455, and 465 that contains a plurality of particles that are diffused from the particles in exit region 407. The plasma in the channels can also be referred to as inter-stage plasmas. Channel 435 comprises interior wall 436 extending between inlet end 434 and outlet end 433 thereof. Channel 445 comprises interior wall 446 extending between inlet end 444 and outlet end 443 thereof. Channel 455 comprises interior wall 456 extending between inlet end 454 and outlet end 453 thereof. Channel 465 comprises interior wall 466 extending between inlet end 464 and outlet end 463 thereof.

In the illustrated embodiment, channels 435, 445, 455, and 465 are cylindrically shaped. Alternately, channels 435, 445, 455, and 465 can have non-cylindrical shapes. Also, channels 435, 445, 455, and 465 are arranged in a ring configuration around axis 401. Housing 422 has a cylindrical shape and is formed, for example of aluminum.

For example, inner channel walls 436, 446, 456, and 466 can be made from a metal oxide such as alumina or silica (quartz) or another insulator or dielectric material.

As illustrated in FIG. 4, inter-stage plasma source 420 further comprises pairs of electrodes and matching networks. Each electrode in a pair is located opposite the other electrode in the pair. RF power at suitable frequencies and power levels is applied to the electrode pairs through the matching networks.

RF source 430 is coupled to electrode 432 through matching network 431. Electrode 432 is mechanically coupled to channel wall 436 but electrically isolated from channel wall 436. Electrode 437 is mechanically and electrically coupled to channel wall 436, thereby forming a grounded electrode.

RF source 440 is coupled to electrode 442 through matching network 441. Electrode 442 is mechanically coupled to channel wall 446 but electrically isolated from channel wall 446. Electrode 447 is mechanically and electrically coupled to channel wall 446, thereby forming a grounded electrode.

RF source 450 is coupled to electrode 452 through matching network 451. Electrode 452 is mechanically coupled to channel wall 456 but electrically isolated from channel wall 456. Electrode 457 is mechanically and electrically coupled to channel wall 456, thereby forming a grounded electrode.

RF source 460 is coupled to electrode 462 through matching network 461. Electrode 462 is mechanically coupled to channel wall 466 but electrically isolated from channel wall 466. Electrode 467 is mechanically and electrically coupled to channel wall 466, thereby forming a grounded electrode.

In other embodiments, alternate electrode configurations can be used, and the electrodes can be connected to the RF sources differently.

The purpose of ISP source 420 is to increase the plasma density at the inlet end of plasma pump 470 thereby increasing the pumping efficiency. Through suitable adjustment of the RF powers to RF antennas the plasma density and temperature can be increased within channels 435, 445, 455, and 465.

The "inter-stage" plasma is a high density local plasma which can have a density on the order of many times that of the source plasma. ISP source 420 ionizes neutral gas particles to increase plasma density and plasma flux in the channels. Due to the increased ratio of plasma to neutral particle flux, ISP source 420 can contribute to enhanced pumping speed and pump compression ratio by ionizing and re-ionizing gas particles in the channels.

The ISP source also comprises a pair of annular electrodes (not shown) used to control the direction of flow of the plasma. For example a top electrodes are included at the interface between the source exit region 407 and the ISP channel 435, 445, 455, and 465 and a bottom electrodes are included in the region between channel 435, 445, 455, and 465 and the plasma pump 475. By biasing the top electrodes more positively than the bottom electrodes by 10, 20 volts or other voltage determined by those skilled in the art, the plasma in the ISP will be controlled to flow in an unidirectional manner down stream to the pump.

In an alternate embodiment, ISP source 420 and plasma pump 430 can be mounted above plasma processing device 410.

Plasma pump 470 comprises housing 472 that includes a plurality of conduits 475 that contain particles that are pumped from the plurality of particles in ISP source 420. The plasma in conduits 475 can be referred to as pump plasma. Conduits 475 are at a higher pressure than first region 405 and may contain a mixture of charged and neutral particles. Plasma pump 470 is configured to pump charged and neutral particles from channels 435, 445, 455, and 465 through conduits 475 so that the pumped particles exit plasma pump 470 via openings 402 in housing 472.

Conduits 435 have interior conduit walls 474 that extends between inlet end 477 and outlet end 479 thereof.

In the illustrated embodiment, conduits 475 are cylindrically shape and are formed, for example of a metal oxide such as alumina or silica (quartz) or another insulator or dielectric material. In addition, housing 472 has a generally cylindrical shape and is also made from a metal oxide such as alumina or silica (quartz) or another insulator or dielectric material. Housing 472 is provided along the exterior periphery of conduits 475 and extends generally parallel to the longitudinally extending axis 401.

In an alternate embodiment, plasma pump 470 can comprise a ring shaped conduit around axis 401.

Figure 5:
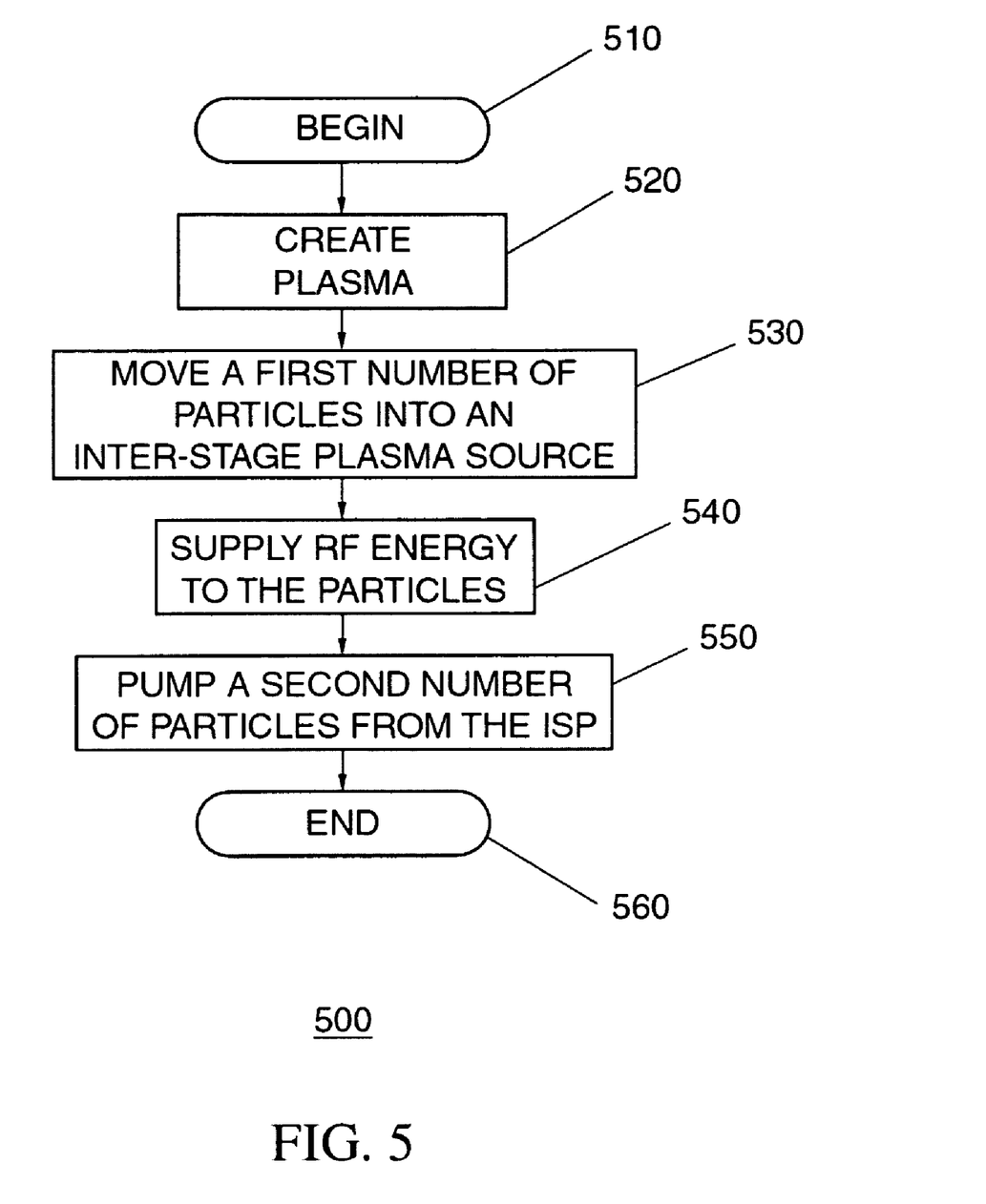
FIG. 5 shows a method of operating an inter-stage plasma source in a plasma processing system in accordance with an embodiment of the present invention.

FIG. 5 shows a method of operating an inter-stage plasma source in a plasma processing system in accordance with another embodiment of the present invention. Procedure 500 illustrates a procedure for pumping particles from a source region in a processing chamber to an exit region, and procedure 500 begins at step 510.

In step 520, plasma is created in a processing chamber. The plasma comprises a first plasma density proximate a processing region and a second plasma density proximate a source region.

In step 530, a first number of particles are moved from the source region into an inter-stage plasma (ISP) source that is fluidly coupled to the plasma processing device proximate the exit region.

In step 540, RF energy is provided to the first number of particles in an inter-stage plasma region of the ISP source. An inter-stage plasma is created having a third plasma density.

In step 550, a second number of particles are pumped from the inter-stage plasma region to an outlet region. In one embodiment, a plasma pump is fluidly coupled to the ISP. The plasma pump comprises a fourth plasma density, and the pumping speed of the plasma pump is dependent upon the third plasma density and the fourth plasma density. Procedure 500 ends in step 560.

Figure 6:
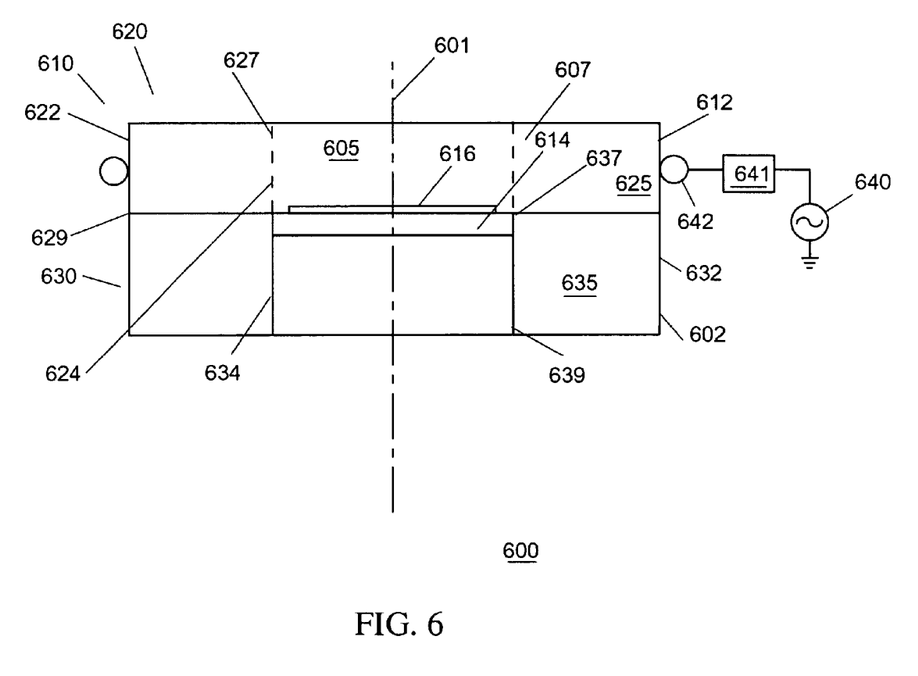
FIG. 6 is a schematic view showing another plasma processing system embodying the principles of the present invention.

FIG. 6 is a schematic view showing another plasma processing system embodying the principles of the present invention. Plasma processing system 600 can comprise plasma processing device 610, inter-stage plasma source 620, and plasma pump 630.

Inter-stage plasma source, generally indicated at 620, is coupled to the plasma processing device, generally indicated at 610, and is coupled to the plasma pump, generally indicated at 630. As shown in FIG. 6, inter-stage plasma (ISP) source 620 can include an inductively coupled plasma (ICP) source.

Plasma processing device 610 can comprise chamber 612 that can define a plasma processing region, generally indicated at 605, and an exit region, generally indicated at 607. During processing, plasma processing region 605 contains a processing plasma (not shown) having a first plasma density, and exit region 607 contains a plasma (not shown) having a second plasma density. For example, the number of particles per unit volume in plasma processing region 605 can be greater than the number of particles per unit volume in exit region 607.

Those skilled in the art will recognize that chamber 612 can contain mounting device 614 which can be configured to attach substrate 616 thereon in order to deposit a layer of material on, or etch material from, the substrate surface.

A plasma generation gas or any other gas which is ionizable to produce a plasma, for example, argon gas, nitrogen gas, xenon gas, or the like, can be introduced into plasma processing device 610, for example by a gas supply system (not shown). The gas supply system and gas are selected according to the desired application as understood by one skilled in the art. Plasma processing device 610 can comprise a plasma source to produce a plasma within plasma processing region 605 and exit region 607. The plasma in exit region 607 can also be referred to as a source plasma for a plasma pump.

Inter-stage plasma (ISP) source 620 can comprise housing 622, which can include channel 625 that contains a plurality of particles that are diffused from the plasma in exit region 607. The plasma in channel 625 can be referred to as an inter-stage plasma. Interior duct wall 624 of channel 625 extend between inlet end 627 and outlet end 629 thereof.

In the illustrated embodiment, channel 625 has an annular shape relative to longitudinal axis 601 and can be formed, for example within or next to chamber 612. For example, inner channel wall 624 has a generally cylindrical shape and can be made from a metal oxide such as alumina or silica (quartz) or another insulator or dielectric material. Inner wall 624 can be provided along the interior periphery of channel 625, can include a number of openings, and extends generally parallel to the longitudinally extending axis 601. In addition, housing 622 has a generally cylindrical shape and can also be made from a metal oxide such as alumina or silica (quartz) or another insulator or dielectric material. Housing 622 can be provided along the exterior periphery of channel 625 and extends generally parallel to the longitudinally extending axis 601.

Inter-stage plasma source 620 further can comprise RF antenna 642, and matching network 641. As illustrated in FIG. 6, RF source 640 can be coupled to RF antenna 642 through matching network 641.

In FIG. 6, a single turn RF antenna 642 is shown extending circumferentially around housing 622. RF power at suitable frequencies and power levels can be applied to RF antenna 642 through matching network 641. Also not shown in FIG. 6 are means such as Faraday shields and dielectric windows well known to those skilled in the art of RF plasma sources. The purpose of ISP source 620 is to increase the plasma density at the inlet end of plasma pump 630 thereby increasing the pumping efficiency. Through suitable adjustment of the RF power to RF antenna 642 the plasma density and temperature can be increased within channel 625.

The "inter-stage" plasma can be a high density local plasma which can have a density on the order of many times that of the source plasma. ISP source 620 can ionize neutral gas particles to increase plasma density and the plasma flux in channel 625. Due to the increased ratio of plasma to neutral particle fluxes, ISP source 620 can contribute to enhanced pumping speed and pump compression ratio by ionizing and re-ionizing gas particles in channel 625.

The ISP source can also comprise one or more annular electrodes (not shown) used to control the direction of flow of the plasma. For example a top electrode can be included at the interface between the source exit region 607 and the ISP channel 625, and a bottom electrode can be included in the region between channel 625 and the plasma pump 635. By biasing the top electrode more positively than the bottom electrode by 10, 20 volts or other voltage determined by those skilled in the art, the plasma in the ISP will be controlled to flow in an unidirectional manner down stream to the pump.

In an alternate embodiment, plasma pump 630 can be mounted above plasma processing device 610.

Plasma pump 630 can comprise housing 632 that can include conduit 635 that can contain a plurality of particles that are diffused from the plasma in ISP source 620. The plasma in conduit 635 can be referred to as pump plasma. Conduit 635 can be at a higher pressure than first region 605 and may contain a mixture of charged and neutral particles. Plasma pump 630 can be configured to pump charged and neutral particles from exit region 607 into channel 635 where the plasma density can be increased using an additional RF source. In addition, plasma pump 630 can be configured to pump charged and neutral particles from channel 625 through conduit 635 so that the pumped particles exit plasma pump 630 via openings 602 in housing 632.

Conduit 635 can have an interior conduit wall 634 that can extend between inlet end 637 and outlet end 639 thereof. Plasma pump 630 can include magnet arrays (not shown) that can be constructed and arranged to generate a magnetic field within conduit 635. In one embodiment, the magnetic field can provide the mechanism for flowing particles into and through the channels in the ISP.

In the illustrated embodiment, conduit 635 has an annular shape and can be formed, for example of aluminum. For example, inner channel wall 634 has a generally cylindrical shape and can comprise a metal oxide such as alumina or silica (quartz) or another insulator or dielectric material. Inner wall 634 can be provided along the interior periphery of conduit 635 and extends generally parallel to the longitudinally extending axis 601. In addition, housing 632 can have a generally cylindrical shape and can also comprise a metal oxide such as alumina or silica (quartz) or another insulator or dielectric material. Housing 632 can be provided along the exterior periphery of conduit 635 and extends generally parallel to the longitudinally extending axis 601.

Figure 7:
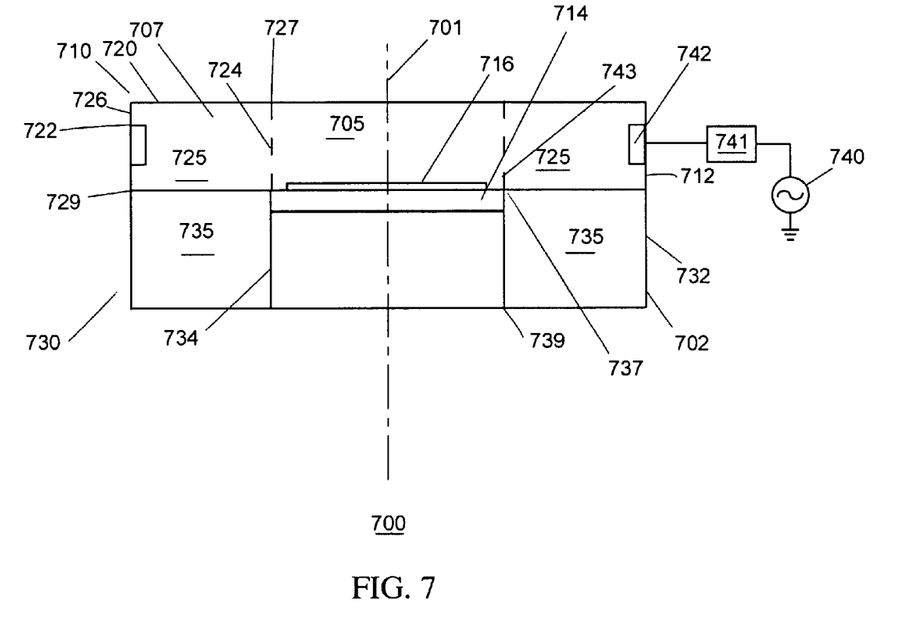
FIG. 7 is a schematic view showing another plasma processing system embodying the principles of the present invention.

FIG. 7 is a schematic view showing another plasma processing system embodying the principles of the present invention. Plasma processing system 700 can comprise plasma processing device 710, inter-stage plasma source 720, and plasma pump 730.

Inter-stage plasma source, generally indicated at 720, can be coupled to the plasma processing device, generally indicated at 710, and can be coupled to the plasma pump, generally indicated at 730. As shown in FIG. 7, inter-stage plasma (ISP) source 720 can include a capacitively coupled plasma (CCP) source.

Plasma processing device 710 can comprise chamber 712 that defines a plasma processing region, generally indicated at 705, and an exit region, generally indicated at 707. During processing, plasma processing region 705 can contain a processing plasma (not shown) having a first plasma density, and exit region 707 can contain a plasma (not shown) having a second plasma density. For example, the number of particles per unit volume in plasma processing region 705 can be greater than the number of particles per unit volume in exit region 707.

Those skilled in the art will recognize that chamber 712 can contain mounting device 714 which can be configured to attach substrate 716 thereon in order to deposit a layer of material on, or etch material from, the substrate surface.

A plasma generation gas or any other gas which is ionizable to produce a plasma, for example, argon gas, nitrogen gas, xenon gas, or the like, can be introduced into plasma processing device 710, for example by a gas supply system (not shown), to be made into plasma. The gas supply system and gas are selected according to the desired application as understood by one skilled in the art. Plasma processing device 710 can comprise a plasma source to produce a plasma within plasma processing region 705 and exit region 707. The plasma in exit region 707 can also be referred to as a source plasma for a plasma pump.

ISP source 720 can comprise housing 722, which can include channel 725 that can contain a plurality of particles that can be diffused from the particles in exit region 707. The plasma in channel 725 can also be referred to as an inter-stage plasma. A longitudinal axis 701 and interior duct wall 724 of channel 725 extend between inlet end 727 and outlet end 729 thereof.

In the illustrated embodiment, channel 725 has an annular shape and can be formed, for example within or next to chamber 712. For example, inner channel wall 724 has a generally cylindrical shape, can include a plurality of openings, and can be made from a metal oxide such as alumina or silica (quartz) or another insulator or dielectric material. Inner wall 724 can be provided along the interior periphery of channel 725 and can extend generally parallel to the longitudinally extending axis 701. In addition, housing 722 can have a generally cylindrical shape and can also comprise a metal oxide such as alumina or silica (quartz) or another insulator or dielectric material. Housing 722 can be provided along the exterior periphery of channel 725 and extends generally parallel to the longitudinally extending axis 701.

Inter-stage plasma source 720 can further comprise a pair of electrodes (742 and 743), and matching network 741. As illustrated in FIG. 7, RF source 740 can be coupled to electrode 742 through matching network 741.

In FIG. 7 a pair of electrodes (742 and 743) are shown extending circumferentially around axis 701. Electrode 743 can be mechanically and electrically coupled to inner wall 724, thereby forming a grounded electrode. Electrode 742 can be mechanically coupled to outer wall 726 but electrically isolated from outer wall 726. RF power at suitable frequencies and power levels can be applied to electrode 742 through matching network 741. Through suitable adjustment of the RF power to electrode 742 the plasma density and temperature can be increased within channel 725. For example, the ISP source 720 is used to increase the plasma density at the inlet end of plasma pump 720 thereby increasing the pumping efficiency.

In other embodiments, alternate electrode configurations can be used, and the electrodes can be connected to the RF source differently.

The "inter-stage" plasma can be a high density local plasma which can have a density on the order of many times that of the source plasma. ISP source 720 can ionize neutral gas particles to increase plasma density and the plasma flux in channel 725. Due to the increased ratio of plasma to neutral particle fluxes, ISP source 720 can contribute to enhanced pumping speed and pump compression ratio by ionizing and re-ionizing gas particles in channel 725.

The ISP source can also comprise a pair of annular electrodes (not shown) used to control the direction of flow of the plasma. For example a top electrode can be included at the interface between the source exit region 707 and the ISP channel 725, and a bottom electrode can be included in the region between channel 725 and the plasma pump 735. By biasing the top electrode more positively than the bottom electrode by 10, 20 volts or other voltage determined by those skilled in the art, the plasma in the ISP will be controlled to flow in an unidirectional manner down stream to the pump.

In an alternate embodiment, plasma pump 730 can be mounted above plasma processing device 710 and ISP source 720.

Plasma pump 730 can comprise housing 732 that can include conduit 735 that can contain a plurality of particles that can be diffused from the plasma in ISP source 720. The plasma in conduit 735 can be referred to as pump plasma. Conduit 735 can be at a higher pressure than first region 705 and may contain a mixture of charged and neutral particles. Plasma pump 730 can be configured to pump charged and neutral particles from channel 725 through conduit 735 so that the pumped particles exit plasma pump 730 via openings 702 in housing 732.

Conduit 735 has an interior conduit wall 734 that extends between inlet end 737 and outlet end 739 thereof.

In the illustrated embodiment, conduit 735 has an annular shape and can be formed, for example of aluminum. For example, inner channel wall 734 has a generally cylindrical shape and can comprise a metal oxide such as alumina or silica (quartz) or another insulator or dielectric material. Inner wall 734 can be provided along the interior periphery of conduit 735 and extends generally parallel to the longitudinally extending axis 701. In addition, housing 732 has a generally cylindrical shape and can also comprise a metal oxide such as alumina or silica (quartz) or another insulator or dielectric material. Housing 732 can be provided along the exterior periphery of conduit 735 and extends generally parallel to the longitudinally extending axis 701.

In another embodiment, the plasma pump comprises a magnetic field having field lines generally parallel to a longitudinal axis of the conduit in the plasma pump and the channel in the ISP source. In alternate embodiments, a magnetic field and a DC electric field can be provided having field lines generally parallel to a longitudinal axis of the conduit. In addition, a time-varying magnetic field and/or a time-varying DC electric field can be provided having field lines generally parallel to a longitudinal axis of the conduit.

The present invention can be applied to a facility other than a plasma processing facility. Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing system comprising:
    a plasma processing device having a first plasma density proximate a processing region and a second plasma density proximate an exit region;
    an inter-stage plasma (ISP) source fluidly coupled to said plasma processing device proximate said exit region, said ISP source comprising a plurality of cylindrical channels arranged in a ring pattern and having an inter-stage plasma region having a third plasma density; and
    a plasma pump fluidly coupled to said ISP source, said plasma pump having a fourth plasma density, wherein pumping speed is dependent upon the third plasma density and the fourth plasma density.

2. The plasma processing system as claimed in claim 1, wherein said first plasma density is greater than said second plasma density.

3. The plasma processing system as claimed in claim 1, wherein said third plasma density is greater than said second plasma density.

4. The plasma processing system as claimed in claim 1, wherein said third plasma density is greater than said fourth plasma density.

5. The plasma processing system as claimed in claim 1, wherein said ISP source comprises an inductively coupled plasma (ICP) source.

6. The plasma processing system as claimed in claim 1, wherein said ISP source comprises a capacitively coupled plasma (CCP) source.

7. The plasma processing system as claimed in claim 1, wherein said plasma pump comprises a ring-shaped channel.

8. The plasma processing system as claimed in claim 1, wherein said plasma pump comprises a plurality of cylindrical channels arranged in a ring pattern.

9. The plasma processing system as claimed in claim 1, wherein said plasma pump comprises:
    an annular conduit having an inlet end coupled to said ISP source, an outlet end, an interior wall, and an outer wall extending from the inlet end to the outlet end; and
    magnet array, constructed and arranged to generate a magnetic field having field lines generally parallel to the outer wall.

10. The plasma processing system as claimed in claim 9, wherein said plasma pump comprises an electric field generator, constructed and arranged to generate a DC electric field having field lines generally parallel to the outer wall.

11. A method of operating a plasma processing system comprising:
    creating a plasma in a plasma processing device, said plasma having a first plasma density proximate a processing region and a second plasma density proximate an exit region;
    moving a first number of particles from said exit region into an inter-stage plasma (ISP) source that is fluidly coupled to said plasma processing device proximate said exit region and comprises a plurality of cylindrical channels arranged in a ring pattern;
    creating an inter-stage plasma having a third plasma density, said ISP source providing RF energy to said first number of particles in an inter-stage plasma region; and
    pumping a second number of particles from said inter-stage plasma region to an exit region, wherein a plasma pump is fluidly coupled to said ISP, said plasma pump having a fourth plasma density, wherein pumping speed is dependent upon the third plasma density and the fourth plasma density.

* * * * *